United States Patent
Ahn

(10) Patent No.: US 11,831,034 B2
(45) Date of Patent: Nov. 28, 2023

(54) BATTERY PACK HAVING FLEXIBLE LINE TO DETECT VOLTAGE AND TEMPERATURE

(71) Applicant: Samsung SDI Co., Ltd., Yongin-si (KR)

(72) Inventor: Byungkook Ahn, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 330 days.

(21) Appl. No.: 17/133,878

(22) Filed: Dec. 24, 2020

(65) Prior Publication Data

US 2021/0203029 A1    Jul. 1, 2021

(30) Foreign Application Priority Data

Dec. 31, 2019    (KR) .................. 10-2019-0179791

(51) Int. Cl.
| | |
|---|---|
| *H01M 50/209* | (2021.01) |
| *H01M 10/643* | (2014.01) |
| *H01M 50/502* | (2021.01) |
| *H01M 50/531* | (2021.01) |
| *H01M 10/42* | (2006.01) |
| *H01M 10/48* | (2006.01) |

(52) U.S. Cl.
CPC ....... *H01M 50/209* (2021.01); *H01M 10/425* (2013.01); *H01M 10/482* (2013.01); *H01M 10/486* (2013.01); *H01M 10/643* (2015.04); *H01M 50/502* (2021.01); *H01M 50/531* (2021.01)

(58) Field of Classification Search
CPC ............ H01M 10/643; H01M 10/425; H01M 10/482; H01M 10/486
See application file for complete search history.

(56) References Cited

U.S. PATENT DOCUMENTS

| | | | |
|---|---|---|---|
| 9,444,086 B2 | 9/2016 | Shimizu et al. | |
| 2002/0102457 A1 | 8/2002 | Oogami et al. | |
| 2011/0076521 A1* | 3/2011 | Shimizu ............. | H01M 50/529 429/82 |
| 2012/0019061 A1 | 1/2012 | Nishihara et al. | |
| 2015/0118530 A1 | 4/2015 | Lee | |

(Continued)

FOREIGN PATENT DOCUMENTS

| | | |
|---|---|---|
| DE | 10 2014 222 899 A1 | 5/2016 |
| JP | 2014-132585 A | 7/2014 |
| JP | 2019-213380 A | 12/2019 |

(Continued)

OTHER PUBLICATIONS

European Search Report for corresponding European Application No. 20217926.3, European Search Report dated Jun. 24, 2021 (12 pgs.).

*Primary Examiner* — Jimmy Vo

(74) *Attorney, Agent, or Firm* — Lewis Roca Rothgerber Christie LLP

(57) ABSTRACT

A battery pack includes a plurality of battery cells electrically connected to each other, and a flexible line comprising a main body arranged at an edge of a cell region in which the plurality of battery cells is arranged, and a first branch portion to detect voltage and a second branch portion to detect temperature which branch from the main body toward the cell region.

22 Claims, 11 Drawing Sheets

(56) References Cited

U.S. PATENT DOCUMENTS

2018/0190960 A1* 7/2018 Harris ................. H01M 10/482

FOREIGN PATENT DOCUMENTS

| JP | 2019213380 A | * 12/2019 | ............... G01K 1/14 |
| KR | 10-2015-0048501 A | 5/2015 | |
| KR | 10-2018-0088197 A | 8/2018 | |
| WO | WO-2019071184 A1 | * 4/2019 | |

* cited by examiner

BATTERY PACK HAVING FLEXIBLE LINE TO DETECT VOLTAGE AND TEMPERATURE

CROSS-REFERENCE TO RELATED APPLICATION

This application claims priority to and the benefit of Korean Patent Application No. 10-2019-0179791, filed on Dec. 31, 2019 in the Korean Intellectual Property Office, the entire disclosure of which is incorporated herein by reference.

BACKGROUND

1. Field

Aspects of one or more embodiments relate to battery packs.

2. Description of the Related Art

In general, secondary batteries are rechargeable, unlike primary batteries. Secondary batteries may be used as energy sources for mobile devices, electric vehicles, hybrid vehicles, electric bicycles, uninterruptible power supplies, or the like, and depending on the types of external devices to which they are applied, the secondary batteries may be used in the form of a single battery or in the form of a battery module in which a plurality of batteries are connected and combined into a unit.

A small mobile device, such as a mobile phone, may operate for a certain time according to the output and capacity of a single battery; however, in the case of long-time driving or high-power driving, such as in the case of an electric vehicle or a hybrid vehicle with high power consumption, a battery module including a plurality of batteries may be preferred due to output and capacity issues, and the battery module may increase the output voltage or the output current according to the number of built-in batteries.

SUMMARY

According to an aspect of one or more embodiments, a battery pack having an improved structure to easily collect state information from a plurality of battery cells is provided.

Additional aspects will be set forth, in part, in the description which follows and, in part, will be apparent from the description, or may be learned by practice of the presented embodiments.

According to one or more embodiments, a battery pack includes: a plurality of battery cells electrically connected to each other, and a flexible line comprising a main body arranged at an edge of a cell region in which the plurality of battery cells is arranged, and a first branch portion to detect voltage and a second branch portion to detect temperature which branch from the main body toward the cell region.

In one or more embodiments, the cell region comprises a plurality of side portions extending in a straight line to surround outer peripheral surfaces of the plurality of battery cells, the main body of the flexible line extends in a first direction along a long-side portion of the plurality of side portions, the first branch portion may extend in a second direction crossing the first direction, and the second branch portion may extend in a diagonal direction between the first and second directions to follow the first direction and the second direction.

In one or more embodiments, the main body of the flexible line may extend from a circuit board arranged at a corner position of the cell region contacting the long-side portion.

In one or more embodiments, the battery pack may further include a plurality of bus bars electrically connecting the plurality of battery cells.

In one or more embodiments, first and second electrodes may be formed at an upper end portion of each of the plurality of battery cells, and the first and second electrodes of the plurality of battery cells may be electrically connected to the plurality of bus bars through a first connection member.

In one or more embodiments, the flexible line may be arranged on the plurality of bus bars.

In one or more embodiments, the first branch portion may include a plurality of first branch portions electrically connected to the plurality of bus bars.

In one or more embodiments, bus bars of the plurality of bus bars may be arranged along the first direction.

In one or more embodiments, the plurality of bus bars may form a plurality of parallel modules including battery cells connected in parallel to each other, among the plurality of battery cells, and parallel modules of the plurality of parallel modules may be arranged along the first direction.

In one or more embodiments, the plurality of bus bars may include first and second bus bars including comb electrodes adjacent to each other and extending in opposite directions from different base portions arranged with a parallel module of the parallel module therebetween.

In one or more embodiments, a comb electrode of a second bus bar may be arranged at an outermost side along an arrangement direction of the comb electrodes, and a comb electrode of a first bus bar may be arranged at an inner position of the outermost side along the arrangement direction of the comb electrodes.

In one or more embodiments, the first branch portion may include a distal first branch portion electrically connected to the first bus bar and extending to be relatively long, and a proximal first branch portion electrically connected to the second bus bar and extending to be relatively short.

In one or more embodiments, the distal first branch portion and the proximal first branch portion may be alternately arranged along a long-side direction in which the main body of the flexible line extends.

In one or more embodiments, a conductive pad may be located at an end of the first branch portion, and the conductive pad and each bus bar may be electrically connected to each other through a second connection member.

In one or more embodiments, while extending along the diagonal direction, the second branch portion may be bent toward an outer peripheral surface of a first battery cell among the plurality of battery cells to be elastically biased with respect to the outer peripheral surface of the first battery cell.

In one or more embodiments, the first battery cell may be a battery cell of which the outer peripheral surface is exposed through the long-side portion of the cell region, among the plurality of battery cells.

In one or more embodiments, the battery pack may further include first and second bus bars electrically connecting the plurality of battery cells and including comb electrodes adjacent to each other, and the second branch portion may be located at a position excluding the second bus bar including an outermost comb electrode relatively adjacent to the long-side portion of the cell region along an arrangement direction of the comb electrodes.

In one or more embodiments, the battery pack may further include a line holder including a channel-shaped groove formed to accommodate the flexible line.

In one or more embodiments, an end of the first branch portion may be supported on the line holder, and a bus bar and a conductive pad located at the end of the first branch portion may be electrically connected to each other by wire bonding.

In one or more embodiments, the line holder may include a main body to support the main body of the flexible line, a branch portion to support the first branch portion, and a guide to guide the second branch portion.

In one or more embodiments, the battery pack may further include a cell holder at which the plurality of battery cells are assembled, and the second branch portion may extend toward an outer peripheral surface of a battery cell of the battery cells exposed from the cell holder by passing through a through hole of the cell holder along the guide of the line holder.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
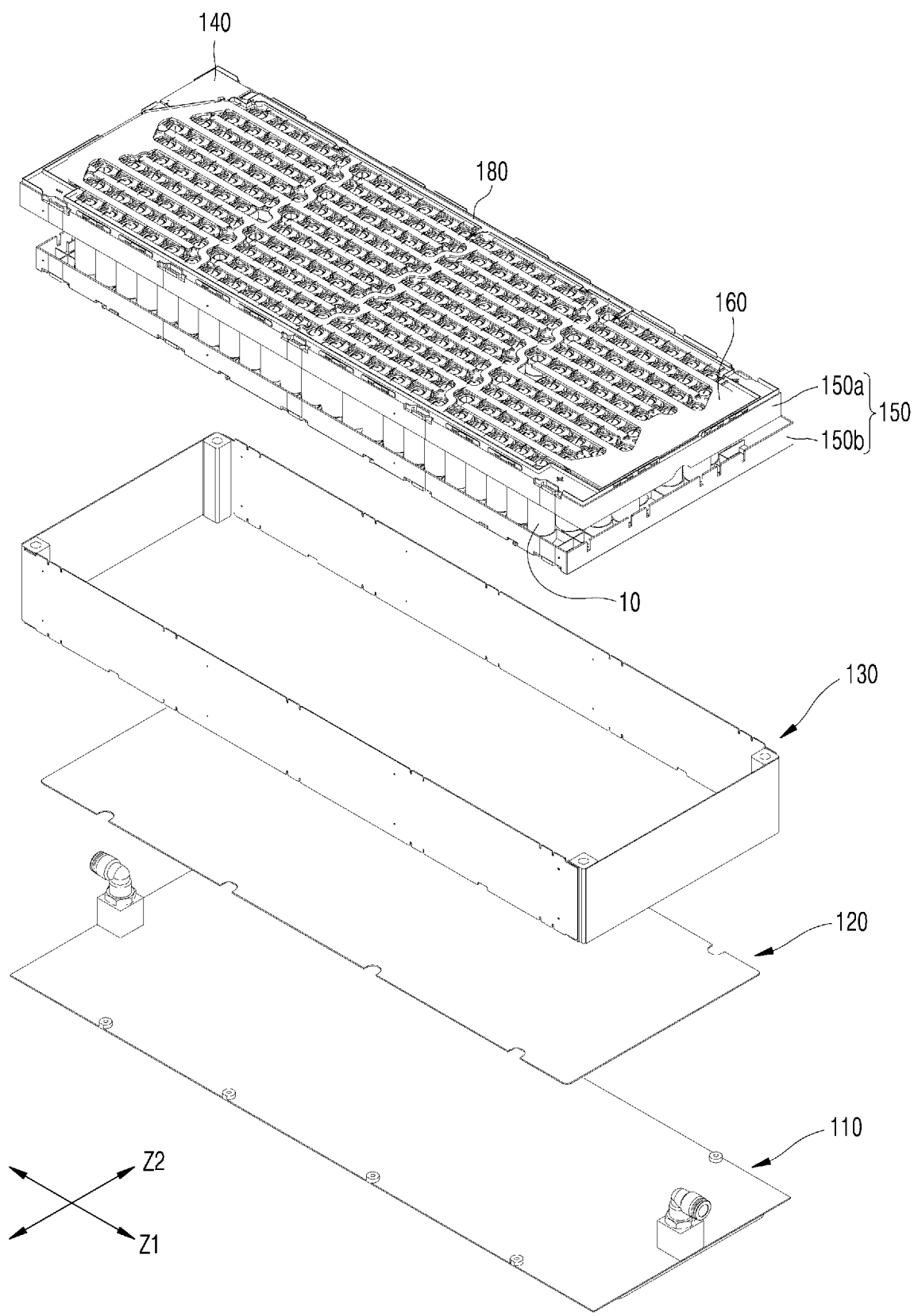
FIG. 1 is an exploded perspective view of a battery pack according to an embodiment.

Reference will now be made in further detail to embodiments, some examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As used herein, the singular forms "a," "an," and "the" are intended to include the plural forms as well, unless the context clearly indicates otherwise.

It is to be understood that the terms "comprise," "include," and "have" used herein specify the presence of stated features or components, but do not preclude the presence or addition of one or more other features or components.

Sizes of components in the drawings may be exaggerated for convenience of description. In other words, since the sizes and thicknesses of components in the drawings may be arbitrarily illustrated for convenience of description, the following embodiments are not limited thereto.

When a certain embodiment may be implemented differently, a particular process order may be performed differently from the described order. For example, two consecutively described processes may be performed substantially at the same time or performed in an order opposite to the described order.

It is to be understood that when a layer, region, or component is referred to as being "connected to" another layer, region, or component, it may be directly connected to the other layer, region, or component or may be indirectly connected to the other layer, region, or component with one or more intervening layers, regions, or components interposed therebetween. For example, it is to be understood that when a layer, region, or component is referred to as being "electrically connected to" another layer, region, or component, it may be directly electrically connected to the other layer, region, or component or may be indirectly electrically connected to the other layer, region, or component with one or more intervening layers, regions, or components interposed therebetween.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, battery packs according to some example embodiments will be described with reference to the accompanying drawings.

Figure 2:
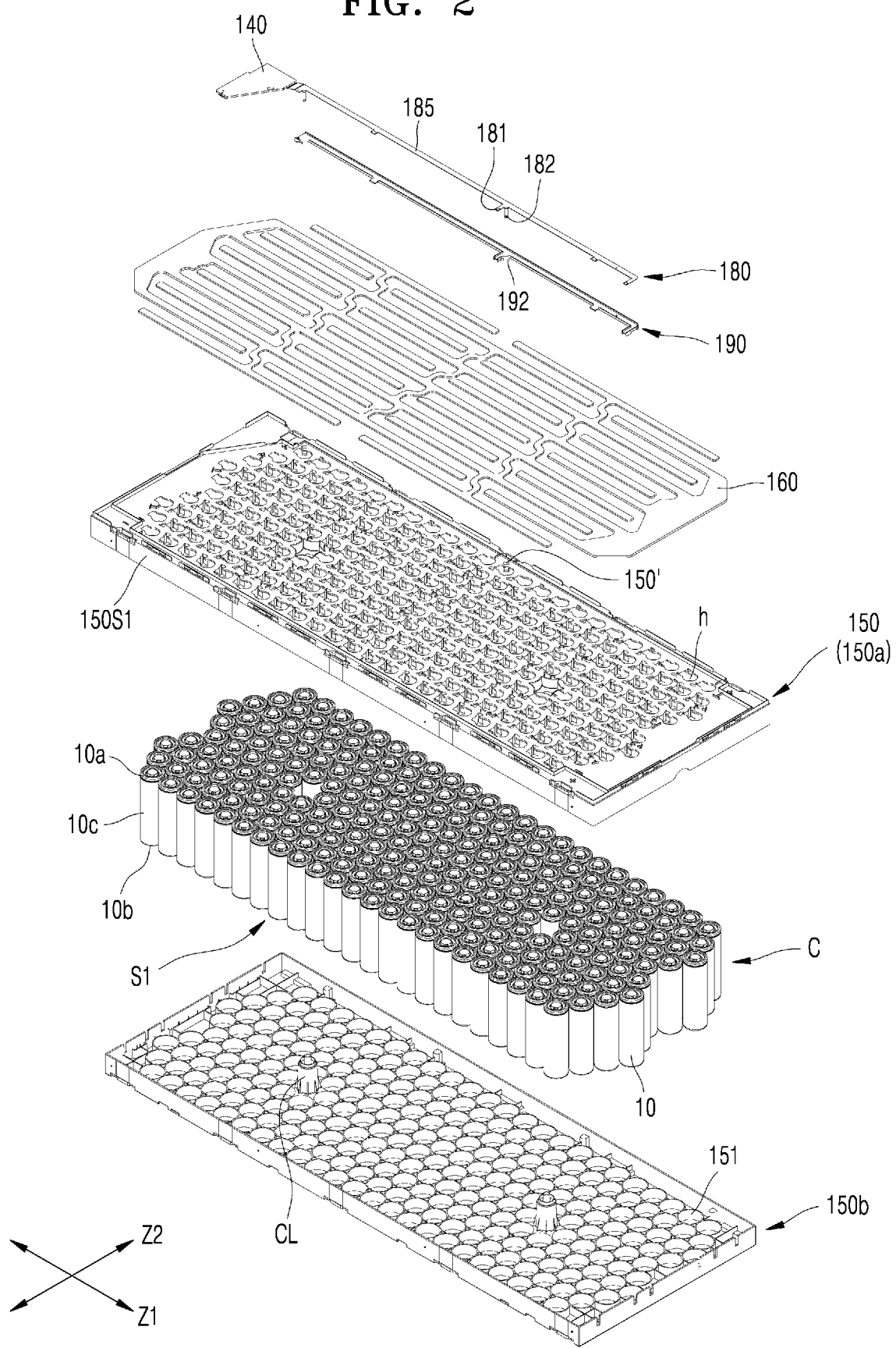
FIG. 2 is an exploded perspective view of a portion of the battery pack illustrated in FIG. 1.
Figure 3:
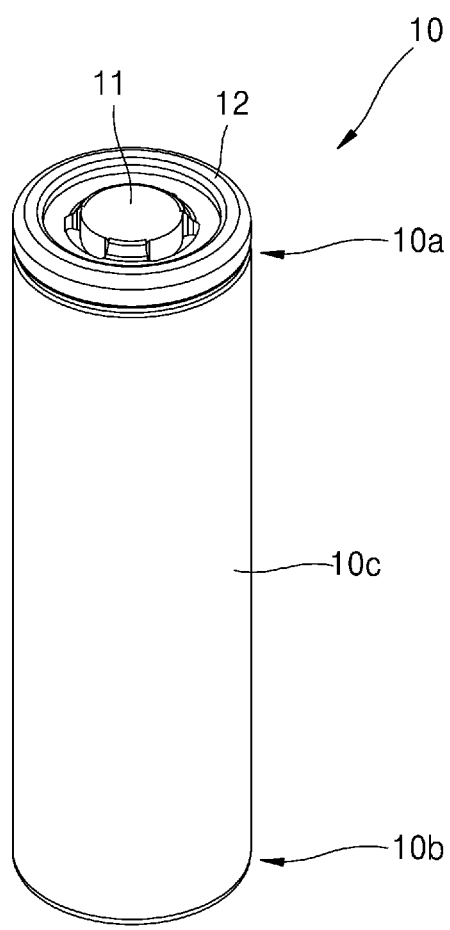
FIG. 3 is a perspective view of a battery cell illustrated in FIG. 2.
Figure 4:
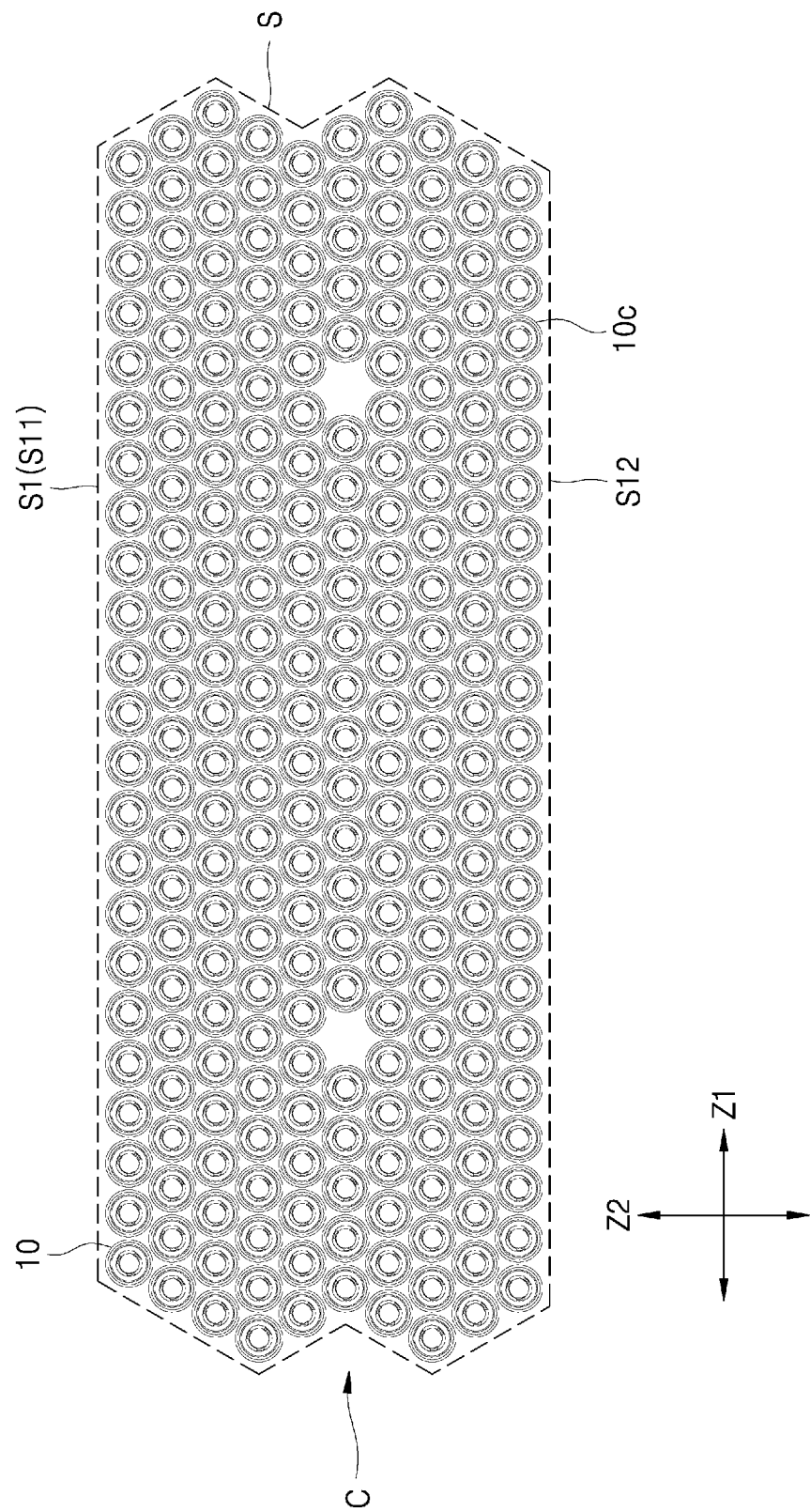
FIG. 4 is a view illustrating a cell region in which a plurality of battery cells illustrated in FIG. 2 are arranged.
Figure 5:
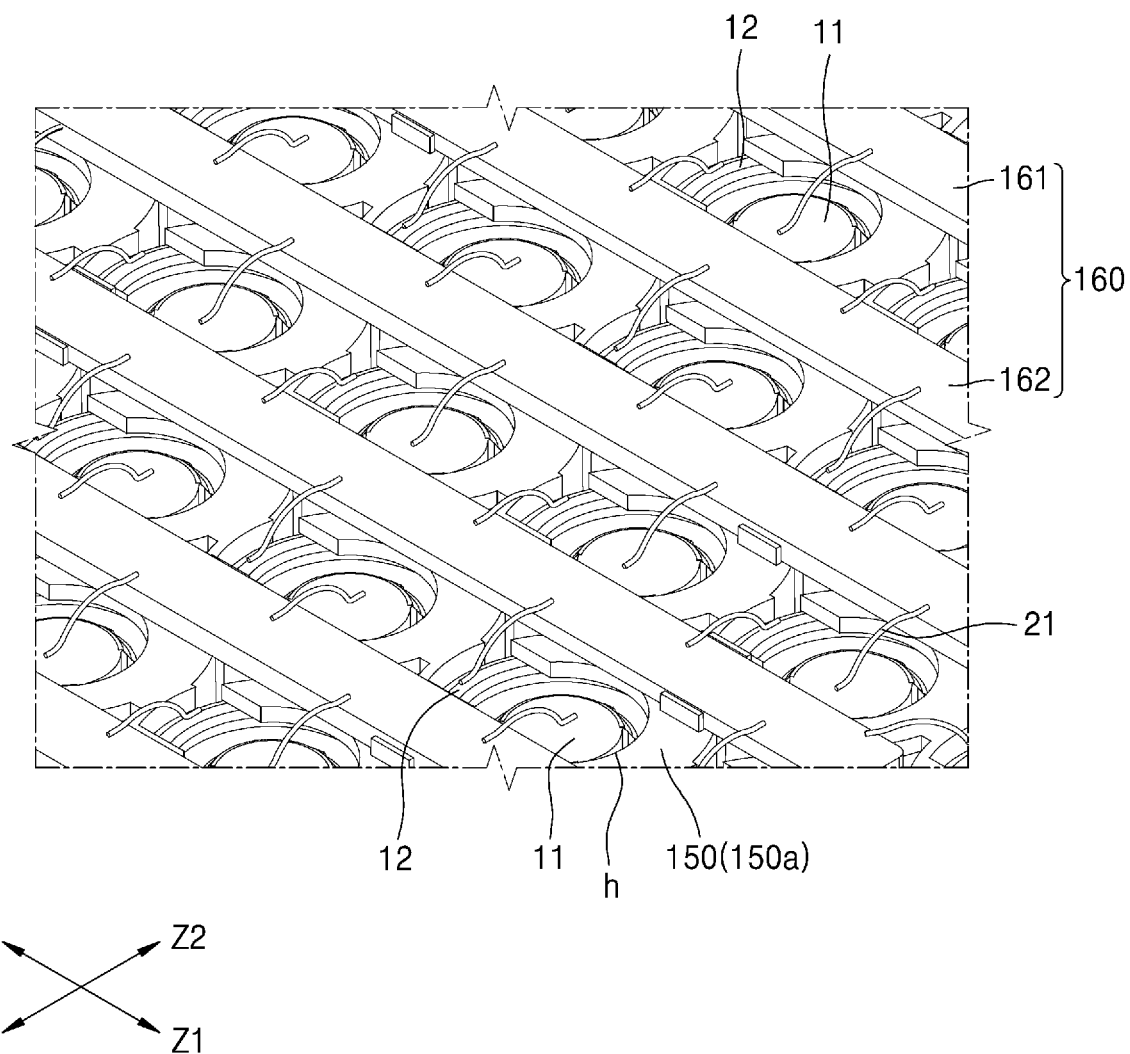
FIG. 5 is a perspective view illustrating a portion of the battery pack illustrated in FIG. 1.

FIG. 1 is an exploded perspective view of a battery pack according to an embodiment; FIG. 2 is an exploded perspective view of a portion of the battery pack illustrated in FIG. 1; FIG. 3 is a perspective view of a battery cell illustrated in FIG. 2; FIG. 4 is a view illustrating a cell region in which a plurality of battery cells illustrated in FIG. 2 are arranged; and FIG. 5 is a perspective view illustrating a portion of the battery pack illustrated in FIG. 1.

Referring to FIG. 2, the battery pack may include a plurality of battery cells 10, a cell holder 150 for providing an assembly position where the plurality of battery cells 10 is assembled and structurally binding the plurality of battery cells 10, and a bus bar 160 for electrically connecting the plurality of battery cells 10.

Referring to FIG. 3, the battery cell 10 may include an upper end portion 10a and a lower end portion 10b along a lengthwise direction thereof and may be provided as a circular or cylindrical battery cell 10 including a cylindrical outer peripheral surface 10c between the upper end portion 10a and the lower end portion 10b. The battery cell 10 may be electrically connected through any one of the upper end portion 10a and the lower end portion 10b, for example, through the upper end portion 10a, and for this, first and second electrodes 11 and 12 of different polarities may be formed at the upper end portion 10a of the battery cell 10. In this case, the first and second electrodes 11 and 12 may be formed at different regions of the upper end portion 10a of the battery cell 10; for example, the first electrode 11 may be formed at a central position of the upper end portion 10a, and the second electrode 12 may be formed at an edge position of the upper end portion 10a surrounding the first electrode 11. In an embodiment, an insulating gasket (not illustrated) may be located between the first and second electrodes 11 and 12 to prevent or substantially prevent a short circuit therebetween. As illustrated in FIG. 5, each battery cell 10 may be connected to the bus bar 160 through a first connection member 21, and the first and second electrodes 11 and 12 of the battery cell 10 may be connected to different first and second bus bars 161 and 162 through the first connection member 21. In an embodiment, the first connection member 21 may be formed of bond wire, and the first and second electrodes 11 and 12 of the battery cell 10 and the bus bar 160 may be electrically connected to each other through wire bonding.

Referring to FIG. 4, a group of battery cells 10 electrically connected to each other may form a cell region C. The cell region C may include a plurality of side portions S extending in a straight line to surround and contact outer peripheral surfaces 10c of the group of battery cells 10. In this case, the cell region C may include a first long-side portion S11 that is longest among the plurality of side portions S and a second long-side portion S12 arranged to face the first long-side portion S11. In an embodiment, the first and second long-side portions S11 and S12 may have substantially the same length and may extend in parallel to each other. Throughout this disclosure, a long-side portions S1 of the cell region C may refer to any one long-side portion S1 among the first and second long-side portions S11 and S12 or may refer to both of the first and second long-side portions S11 and S12.

In the embodiment illustrated in FIG. 2, the long-side portions S1 of the cell region C may be formed in parallel at positions corresponding to long-side portions 150S1 of the cell holder 150. That is, a long-side direction Z1 of the cell region C may refer to the same direction as a direction Z1 of the long-side portion 150S1 of the cell holder 150, and herein, the long-side direction Z1 may refer to the long-side direction Z1 of the cell region C or the direction Z1 of the long-side portion 150S1 of the cell holder 150. Also, the long-side portion S1 of the cell region C and the long-side portion 150S1 of the cell holder 150 may represent positions corresponding to each other and may represent an edge position of the battery pack.

Referring to FIG. 2, the cell holder 150 may include a cell assembly portion 151 surrounding at least a portion of the outer peripheral surface 10c of the battery cell 10 to define an assembly position of the battery cell 10 and a terminal hole h formed in the cell assembly portion 151. In an embodiment, the battery cells 10 adjacent to each other on the outer peripheral surfaces 10c may be densely arranged to be fitted to valley regions between one another, and the cell assembly portions 151 of the battery cells 10 may also be densely arranged according to the dense arrangement of the battery cells 10. As illustrated in FIG. 5, the terminal hole h may expose at least a portion of the upper end portion 10a of the battery cell 10, and the first and second electrodes 11 and 12 exposed through the terminal hole h may be respectively connected to different first and second bus bars 161 and 162 through the first connection member 21. That is, the terminal hole h may expose the first electrode 11 at the central position and the second electrode 12 at the edge position at the upper end portion 10a of the battery cell 10 together, and the first and second electrodes 11 and 12 may be respectively connected to different first and second bus bars 161 and 162 through the first connecting member 21.

Referring to FIG. 2, the cell holder 150 may include an upper cell holder 150a surrounding an outer peripheral surface 10c adjacent to the upper end portion 10a of the battery cell 10 and a lower cell holder 150b surrounding an outer peripheral surface 10c adjacent to the lower end portion 10b of the battery cell 10. Also, a portion of the outer peripheral surface 10c of the battery cell 10 may be exposed between the upper cell holder 150a and the lower cell holder 150b, and, as described below, temperature information may be detected through the outer peripheral surface 10c of the battery cell 10 exposed between the upper cell holder 150a and the lower cell holder 150b. Referring to FIG. 2, a column member CL for maintaining a suitable distance therebetween to accommodate the battery cell 10 along the height direction of the battery cell 10 may be located between the upper cell holder 150a and the lower cell holder 150b. The column member CL may extend along the height direction of the battery cell 10 and may protrude from one of the cell holders 150a and 150b toward the other of the cell holders 150a and 150b with the base of the one of the cell holders 150a and 150b. For example, in an embodiment, the column member CL may protrude from the lower cell holder 150b toward the upper cell holder 150a along the height direction of the battery cell 10. As such, in an embodiment, the column member CL may protrude from the lower cell holder 150b toward the upper cell holder 150a along the height direction of the battery cell 10, and an assembly position of the column member CL may be formed in the upper cell holder 150a. For example, a space for fitting the column member CL may be formed at an assembly position corresponding to the column member CL in the upper cell holder 150a. The column member CL may reinforce the structural rigidity of a cell holder of the upper cell holder 150a and the lower cell holder 150b. In an embodiment, the column member CL may be formed at the lower cell holder 150b to reinforce the structural rigidity of the lower cell holder 150b. A blank of the battery cell 10 not filled with the battery cell 10 may be formed at a position corresponding to the column member CL, and lack of heat dissipation and heat concentration that may be caused by a plurality of battery cells 10 being densely arranged adjacent to each other may be somewhat alleviated through the blank of the battery cell 10 in the cell region C where a plurality of battery cells 10 is arranged.

A bus bar 160 and a flexible line 180 electrically connected to the bus bar 160 may be sequentially arranged on the cell holder 150, that is, on the upper cell holder 150a, and a line holder 190 accommodating the flexible line 180 may be arranged between the flexible line 180 and the bus bar 160. In an embodiment, the bus bar 160 and the flexible line 180 may be arranged on the upper cell holder 150a, and the bus bar 160 and the flexible line 180 may be arranged at positions at least partially overlapping each other or may be arranged at positions not overlapping each other. In an embodiment, when the bus bar 160 and the flexible line 180 are arranged at positions overlapping each other, electrical interference may be prevented or substantially prevented due to the insulating line holder 190 being located therebetween.

As described below, a second branch portion 182 of the flexible line 180 may approach the outer peripheral surface 10c of the battery cell 10 exposed from the upper cell holder 150a by passing through a through hole 150' of the upper cell holder 150a. That is, the through hole 150' for passing the second branch portion 182 may be formed in the upper cell holder 150a. This will be described below in more detail.

In an embodiment, both the first and second electrodes 11 and 12 may be electrically connected through the upper end portion 10a of the battery cell 10, and the battery cell 10 may be cooled through the lower end portion 10b of the battery cell 10. As illustrated in FIG. 1, the lower end portion 10b of the battery cell 10 may be exposed from the lower cell holder 150b and cooled by a cooling plate 110, and a heat transmission medium 120 may be located between the lower end portion 10b of the battery cell 10 and the cooling plate 110. In an embodiment, a frame 130 may be arranged along the periphery of the cell holder 150 where the plurality of battery cells 10 is assembled, and the frame 130 may protect the internal configuration of the battery pack while surrounding the cell holder 150 and the cooling plate 110.

Figure 6:
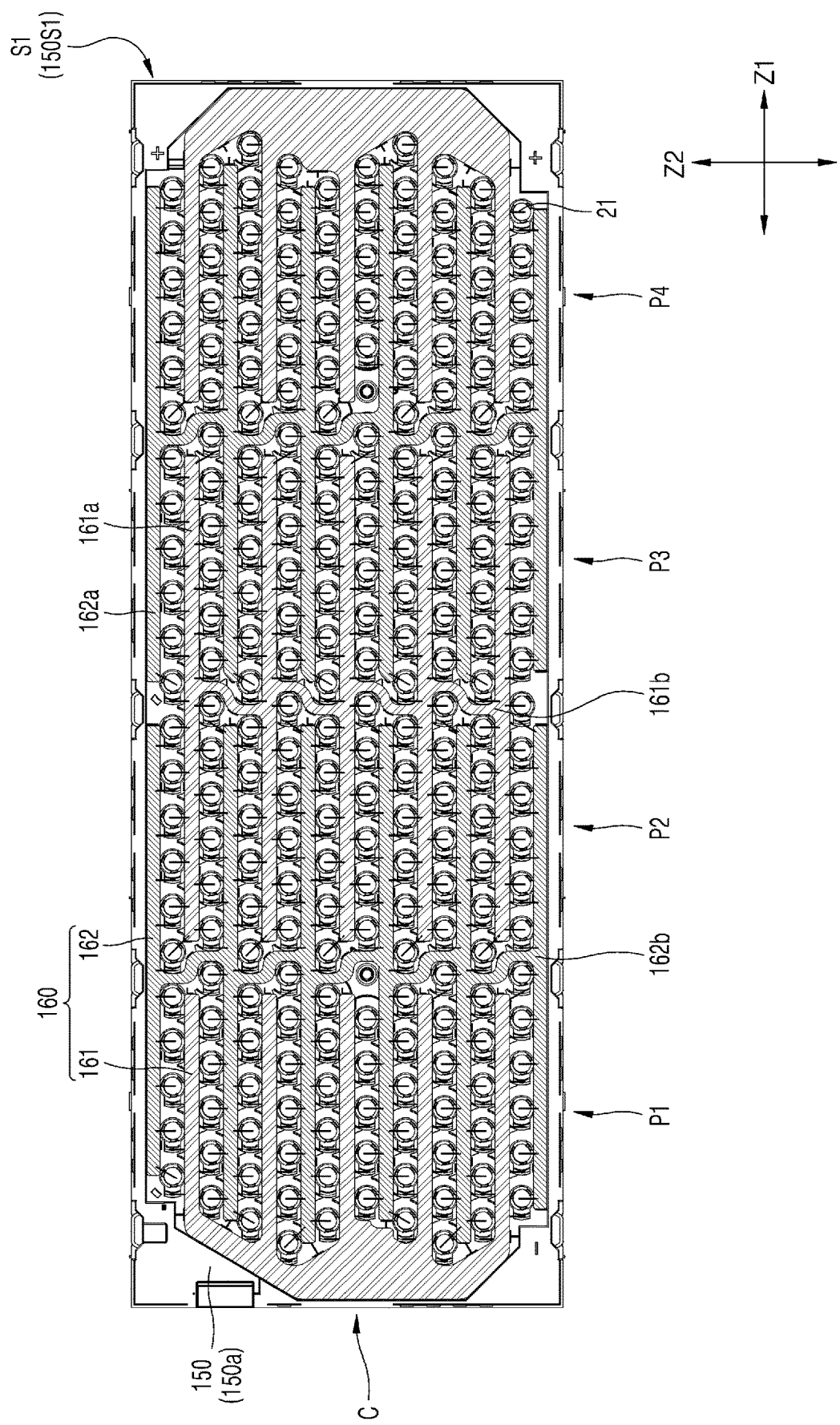
FIG. 6 is a view illustrating an arrangement of a bus bar illustrated in FIG. 1.
Figure 7:
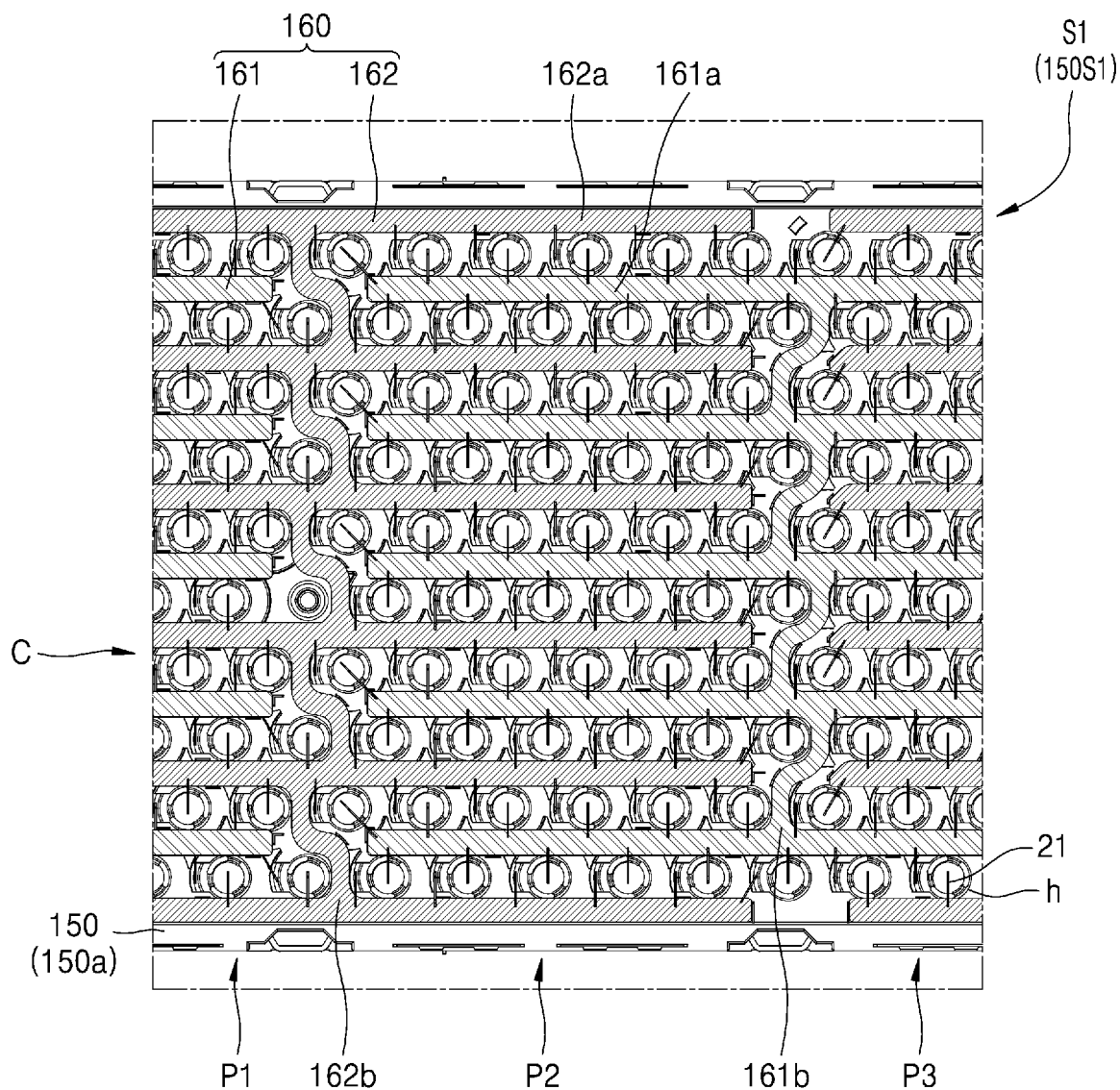
FIG. 7 is a view illustrating an arrangement of a bus bar in a region of FIG. 6.
Figure 8:
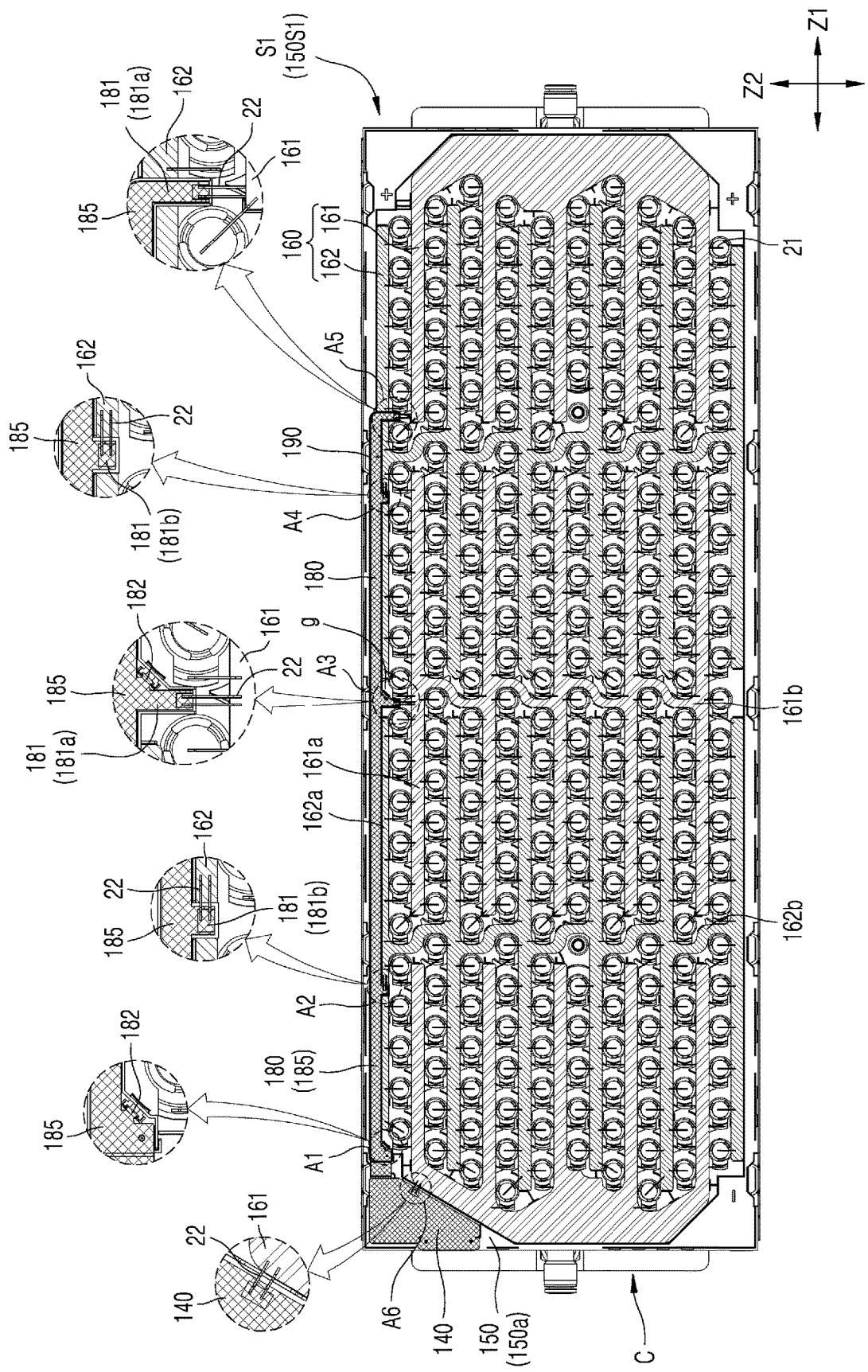
FIG. 8 is a view for describing a configuration of a flexible line illustrated in FIG. 1, in which enlarged views of regions "A1" to "A6" of FIG. 8 are also illustrated.
Figure 9:
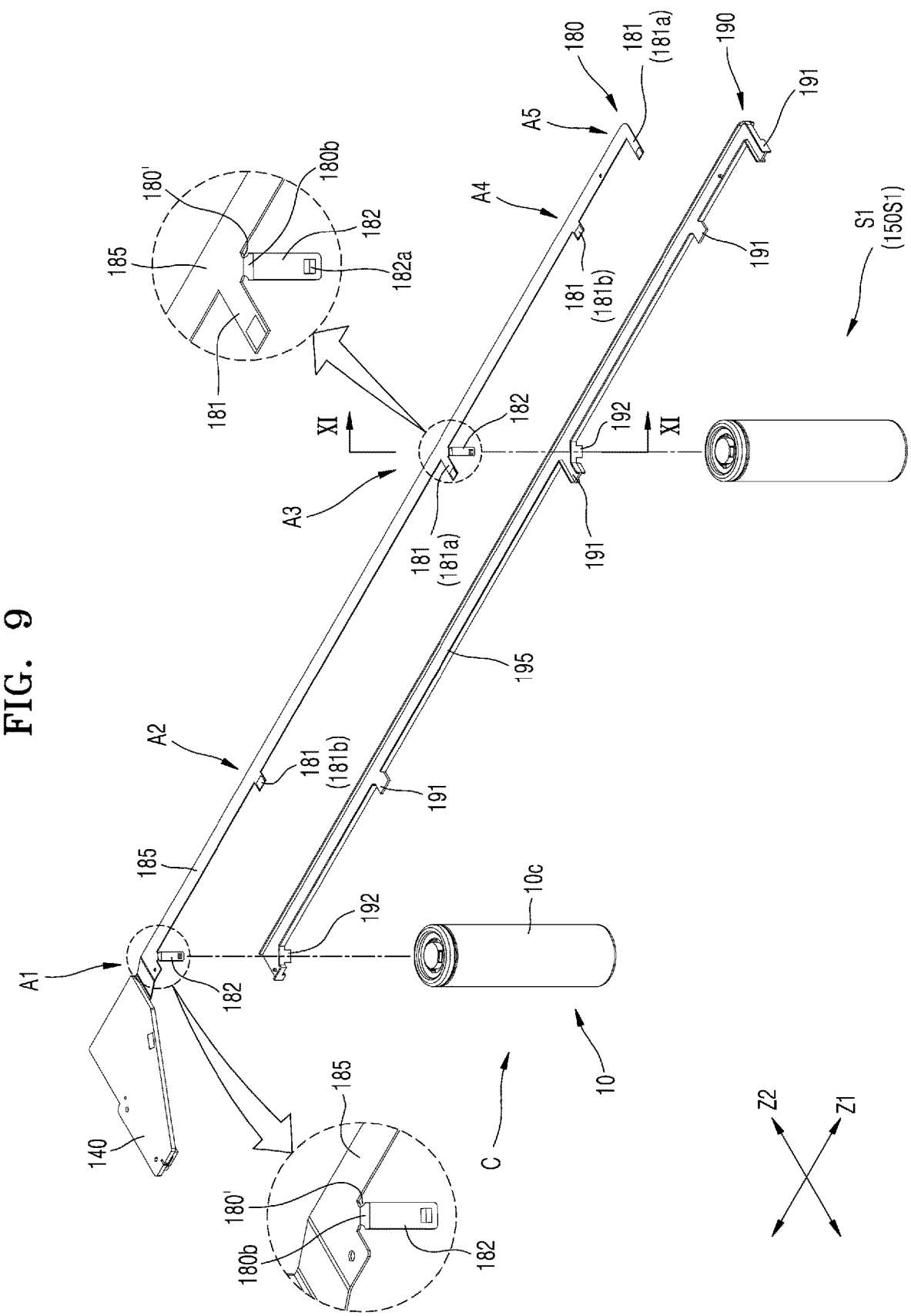
FIG. 9 is an exploded perspective view of the flexible line and a line holder illustrated in FIG. 8.
Figure 10:
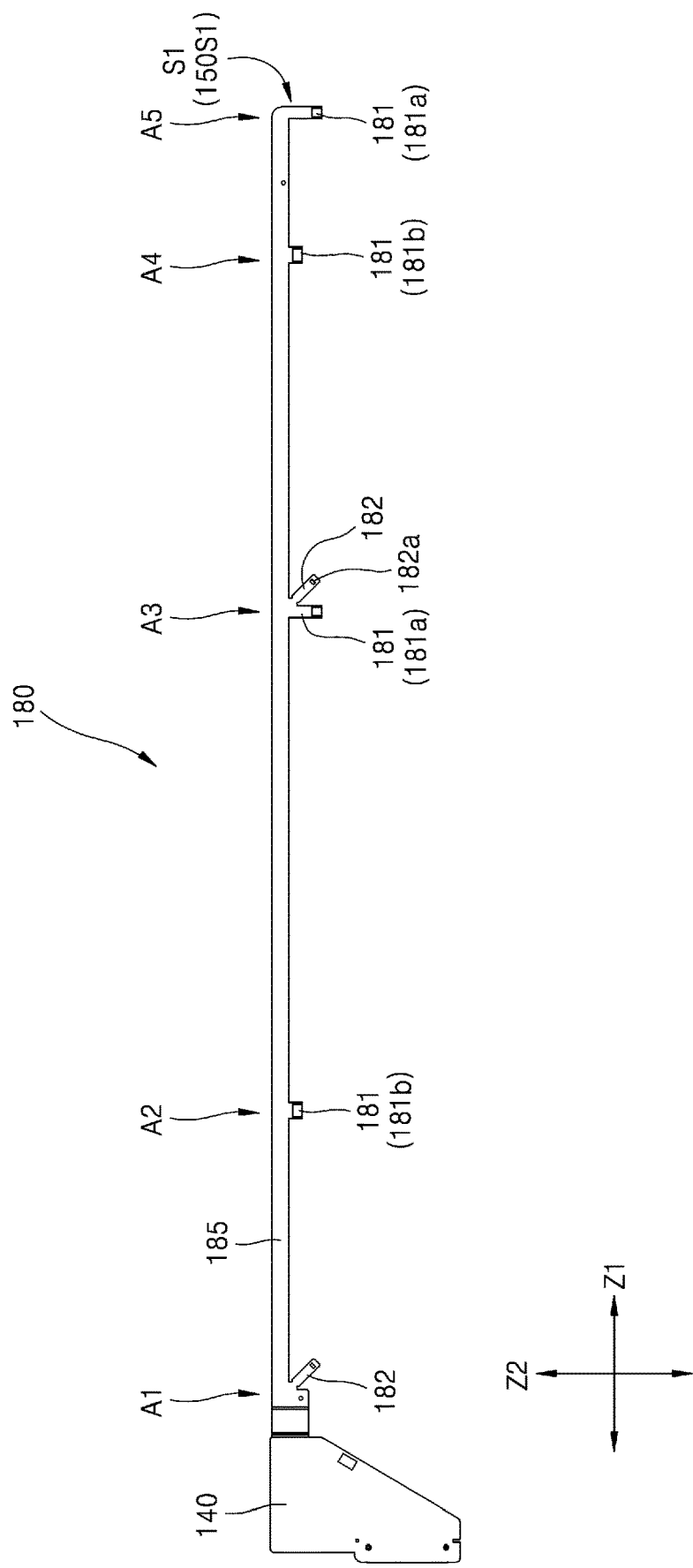
FIG. 10 is a plan view illustrating the flexible line of FIG. 9.
Figure 11:
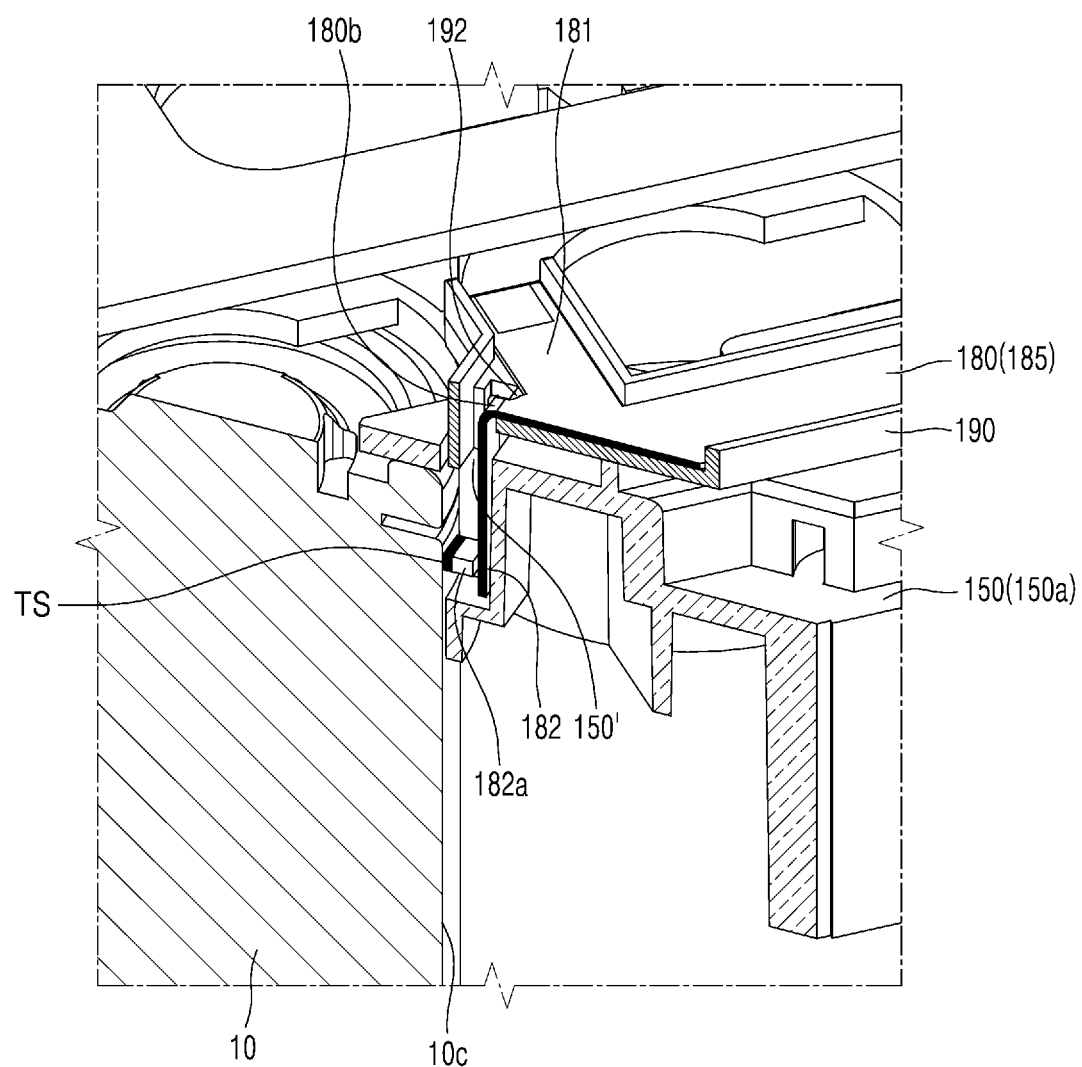
FIG. 11 is a cutaway perspective view taken along the line XI-XI of FIG. 9, taken from a rotated perspective for convenience of understanding.

FIG. 6 is a view illustrating an arrangement of a bus bar illustrated in FIG. 1; FIG. 7 is a view illustrating an arrangement of a bus bar in a region of FIG. 6; FIG. 8 is a view for describing a configuration of a flexible line illustrated in FIG. 1, in which enlarged views of regions "A1" to "A6" of FIG. 8 are also illustrated; FIG. 9 is an exploded perspective view of the flexible line and a line holder illustrated in FIG. 8; FIG. 10 is a plan view illustrating the flexible line of FIG. 9; and FIG. 11 is a cutaway perspective view taken along the line XI-XI of FIG. 9, taken from a rotated perspective for convenience of understanding.

Referring to FIG. 6, a bus bar 160 for electrically connecting a plurality of battery cells 10 may be arranged on the cell holder 150. The bus bars 160 may include first and second bus bars 161 and 162 that are alternately arranged along the long-side direction Z1 of the cell region C or the direction Z1 of the long-side portion 150S1 of the cell holder 150. The first and second bus bars 161 and 162 may include a plurality of comb electrodes 161a and 162a that are fitted or adjacent to each other in a comb shape. To form an electrical connection with any parallel module P1, P2, P3, or P4, the comb electrodes 161a and 162a of the first and second bus bars 161 and 162 may protrude toward the corresponding parallel module P1, P2, P3, or P4 from different base portions 161b and 162b arranged with the corresponding parallel module P1, P2, P3, or P4 therebetween. Here, the first and second bus bars 161 and 162 may refer to different bus bars 160 that are alternately arranged along the long-side direction Z1 of the cell region C and may refer to different bus bars 160 that are fitted to each other in a comb shape to form an electrical connection with the corresponding parallel module P1, P2, P3, or P4. For example, because the first and second bus bars 161 and 162 are not classified according to structural differences, the first bus bars 161 may not need to have the same structure or the second bus bars 162 may not need to have the same structure, and, also, the first and second bus bars 161 and 162 may not need to have different structures.

In an embodiment, while the first and second bus bars 161 and 162 arranged alternately with each other are fitted to each other, the second bus bar 162 (the comb electrode 162a of the second bus bar 162) may be formed at an outermost position along an arrangement direction Z2 of the comb electrodes 161a and 162a, and the first bus bar 161 (the comb electrode 161a of the first bus bar 161) may be formed at an inner position of the outermost side. For example, the second bus bar 162 may include a relatively larger number of comb electrodes 162a than the first bus bar 161. In this case, the second bus bar 162 (the comb electrode 162a of the second bus bar 162) formed at the outermost position along the arrangement direction Z2 of the comb electrodes 161a and 162a may be formed at a position relatively close to the long-side portion S1 of the cell region C or the long-side portion 150S1 of the cell holder 150, and the first bus bar 161 (the comb electrode 161a of the first bus bar 161) formed at an inner position of the second bus bar 162 (the comb electrode 162a of the second bus bar 162) may be formed at a position relatively far from the long-side portion S1 of the cell region C or the long-side portion 150S1 of the cell holder 150. As illustrated in FIG. 8, the flexible line 180 may include a first branch portion 181 for voltage detection and a second branch portion 182 for temperature detection, wherein the first branch portion 181 may include a distant, or distal, first branch portion 181a extending to be relatively long and a close, or proximal, first branch portion 181b extending to be relatively short according to a position of the alternately-arranged first and second bus bars 161 and 162. Also, the second branch portion 182 may be formed at a position excluding the second bus bar 162 adjacent to the long-side portion S1 of the cell region C or the long-side portion 150S1 of the cell holder 150. This will be described below in more detail.

Referring to FIG. 6, while the comb electrodes 161a and 162a of the first and second bus bars 161 and 162 protrude from the base portions 161b and 162b along the long-side direction Z1 in opposite directions of a forward direction and a reverse direction, the comb electrodes 161a and 162a of the first and second bus bars 161 and 162 protruding in opposite directions may be fitted or adjacent to each other. The bus bar 160 may form different parallel modules P1, P2, P3, and P4 with respect to a boundary of the base portions 161b and 162b. For example, a parallel module P1, P2, P3, or P4 may be formed between the base portions 161b and 162b of the first and second bus bars 161 and 162. The parallel modules P1, P2, P3, and P4 may refer to a group of battery cells 10 connected in parallel to each other, and the parallel modules P1, P2, P3, and P4 adjacent to each other may be connected in series. More particularly, the bus bar 160 may form a parallel connection while connecting the second electrodes 12 to each other and the first electrodes 11 to each other in the battery cells 10 belonging to the same parallel module P1, P2, P3, or P4 with respect to a boundary of the base portions 161b and 162b. Also, the bus bar 160 may form a serial connection while connecting different first and second electrodes 11 and 12 to each other in the battery cells 10 belonging to different parallel modules P1, P2, P3, and P4 arranged adjacent to each other with respect to a boundary of the base portions 161b and 162b.

Referring to FIG. 7, the bus bar 160 may include first and second bus bars 161 and 162 fitted to each other in a comb shape, and a parallel module P1, P2, P3, or P4, for example, a second parallel module P2, may be formed between the base portions 161b and 162b of the first and second bus bars 161 and 162. Also, the second parallel module P2 and a first parallel module P1 adjacent thereto may be connected in series to each other with respect to a boundary of the base portion 162b of the second bus bar 162 and, similarly, the second parallel module P2 and a third parallel module P3 adjacent thereto may be connected in series to each other with respect to a boundary of the base portion 161b of the first bus bar 161.

In an embodiment, that the bus bar 160 connects the battery cells 10 belonging to the same parallel module P1, P2, P3, or P4 in parallel or connects the battery cells 10 belonging to adjacent parallel modules P1, P2, P3, and P4 in series may mean that, instead of being implemented by the structure of the bus bar 160 itself, a parallel connection or a serial connection may be implemented according to the connection structure between the bus bar 160 and the first and second electrodes 11 and 12 of the battery cell 10, that is, whether the first connection member 21 connects the first electrodes 11 of different battery cells 10 to the same bus bar 160 or the first connection member 21 connects the first and second electrodes 11 and 12 of different battery cells 10 to the same bus bar 160. For example, the first connection member 21 may form a parallel connection by connecting the first electrodes 11 of battery cells 10 belonging to the same parallel module P1, P2, P3, or P4 to the same bus bar 160 and the second electrodes 12 of the battery cells 10 to the same bus bar 160, and the first connection member 21 may form a serial connection by connecting the different first and second electrodes 11 and 12 of battery cells 10 belonging to the adjacent parallel modules P1, P2, P3, and P4 to the same bus bar 160.

The first and second bus bars 161 and 162 electrically connected to the second parallel module P2 may include a plurality of comb electrodes 161a and 162a that are alternately arranged with the battery cells 10 of different rows belonging to the second parallel module P2 therebetween. That is, the comb electrodes 161a and 162a of the first and second bus bars 161 and 162 may be arranged to face each other with a column of battery cells 10 therebetween, and, in this case, the first and second electrodes 11 and 12 of a row of battery cells 10 may be connected together through the first connection member 21 to the comb electrodes 161a and 162a of the first and second bus bars 161 and 162 arranged at opposite sides, thereby forming a parallel connection. As such, the second parallel module P2 arranged between the base portions 161b and 162b of the first and second bus bars 161 and 162 may be connected together to the comb electrodes 161a and 162a of the first and second bus bars 161 and 162 to form a parallel connection.

The second bus bar 162 extending across the second parallel module P2 and the first parallel module P1 with respect to a boundary of the base portion 162b may be connected to the second electrode 12 in the second parallel module P2 and connected to the first electrode 11 in the first parallel module P1 to connect the first and second parallel modules P1 and P2 in series to each other. Similarly, the first bus bar 161 extending across the second parallel module P2 and the third parallel module P3 with respect to a boundary of the base portion 161b may be connected to the first electrode 11 in the second parallel module P2 and connected to the second electrode 12 in the third parallel module P3 to connect the second and third parallel modules P2 and P3 in series to each other.

The base portions 161b and 162b may form a boundary between different parallel modules P1, P2, P3, and P4 and, in an embodiment, may include a portion extending in a curved shape across the terminal holes h for exposing the upper end portion 10a of the battery cell 10, more particularly, the first and second electrodes 11 and 12 of the battery cell 10. The base portions 161b and 162b may electrically connect a plurality of comb electrodes 161a and 162a and may extend across a plurality of comb electrodes 161a and 162a. For example, a portion of the base portions 161b and 162b may connect a pair of comb electrodes 161a and 162a adjacent to each other and may extend in a curved shape to connect different portions of a pair of comb electrodes 161a and 162a adjacent to each other.

Referring to FIG. 6, in an embodiment, because parallel modules P1, P2, P3, and P4 adjacent to each other in a direction in which different parallel modules P1, P2, P3, and P4 are arranged may be connected in series, a direction Z1 in which the different parallel modules P1, P2, P3, and P4 are arranged may be referred to as a serial connection direction and the parallel modules P1, P2, P3, and P4 adjacent to each other may be connected in series as the first and second bus bars 161 and 162 are alternately arranged along the serial connection direction Z1. In an embodiment, the serial connection direction Z1 may correspond to the long-side direction Z1 of the cell region C or the direction Z1 of the long-side portion 150S1 of the cell holder 150, a plurality of parallel modules P1, P2, P3, and P4 may be arranged along the long-side direction Z1, and adjacent parallel modules P1, P2, P3, and P4 may be connected in series as the first and second bus bars 161 and 162 are alternately arranged along the long-side direction Z1. In an embodiment, by forming the serial connection direction Z1 in the long-side direction Z1 of the cell region C, a plurality of parallel modules P1, P2, P3, and P4 may be formed along the long-side direction Z1 of the cell region C and the output of the battery pack may be sufficiently increased to a required or desired level. Further, the parallel modules P1, P2, P3, and P4 formed between the base portions 161b and 162b of the first and second bus bars 161 and 162 may be formed along a direction intersecting with the long-side direction Z1, for example, a direction Z2 perpendicular to the long-side direction Z1, and the direction Z2 perpendicular to the long-side direction Z1 may be defined as a parallel connection direction Z2.

Referring to FIG. 8, together with the bus bar 160, a flexible line 180 may be arranged on the cell holder 150. Also, in an embodiment, a circuit board 140 electrically connected to the flexible line 180 may be arranged on the cell holder 150. The flexible line 180 may be configured to detect state information of the battery cell 10, such as the voltage and temperature of the battery cell 10. The flexible line 180 may extend from the circuit board 140 along the long-side direction Z1 and may transmit voltage information and temperature information of the battery cell 10 to the circuit board 140. In an embodiment, the flexible line 180 may include a main body 185 extending along the long-side direction Z1 and a first branch portion 181 for voltage detection and a second branch portion 182 for temperature detection which branch from the main body 185.

The flexible line 180, more particularly, the main body 185 of the flexible line 180, may extend along the long-side direction Z1 at the position of the long-side portion S1 of the cell region C or the long-side portion 150S1 of the cell holder 150. The long-side direction Z1 may be the serial connection direction Z1 in which different parallel modules P1, P2, P3, and P4 are arranged and may refer to a direction in which the first and second bus bars 161 and 162 are alternately arranged, and the flexible line 180 may detect each voltage information by being electrically connected to the different first and second bus bars 161 and 162 while extending along the long-side direction Z1 in which the first and second bus bars 161 and 162 are alternately arranged.

In an embodiment, the main body 185 of the flexible line 180 may extend from the circuit board 140 and may extend along the long-side portion S1 by extending from the circuit board 140 arranged at a corner position of the cell region C contacting the long-side portion S1. The main body 185 of the flexible line 180 may detect the voltage information and temperature information of the battery cell 10 through the first and second branch portions 181 and 182 extending toward the cell region C while extending along the long-side portion S1 of the cell region C.

The first and second branch portions 181 and 182 may branch from the main body 185 arranged at the long-side portion S1 of the cell region C and extend toward the cell region C. In this case, the first branch portion 181 may include a conductive pad at an end electrically connected to the bus bar 160 and detect voltage information from the bus bar 160. The conductive pad formed at the end of the first branch portion 181 may be exposed from an insulating cover of the flexible line 180, and the conductive pad and the bus bar 160 may be electrically connected to each other through a second connection member 22 (see regions "A2" to "A5" of FIG. 8). For example, the conductive pad and the bus bar 160 may be electrically connected to each other through a bond wire as the second connection member 22. As described below, the flexible line 180 including the first branch portion 181 may be supported on the line holder 190, and the first branch portions 181 supported on the insulating line holder 190 may be electrically connected through an upper portion rather than a lower portion facing the line holder 190 and may be electrically connected to each other through the second connection member 22 extending in a suspended state toward the bus bar 160 from the conductive pad formed at the end of the first branch portion 181. Because the end of the first branch portion 181 may be firmly supported on the line holder 190, the bus bar 160 and the conductive pad formed at the end of the first branch portion 181 may be electrically connected to each other through wire bonding. In an embodiment, referring to FIG. 9, the second branch portion 182 may include a thermistor 182a at an end that contacts or approaches the outer peripheral surface 10c of the battery cell 10, to detect temperature information from the outer peripheral surface 10c of the battery cell 10. For example, the thermistor 182a may be provided as a chip-type thermistor that may be directly mounted on the flexible line 180 through solder mounting.

Referring to FIG. 8, the first branch portion 181 may branch from the main body 185 of the flexible line 180 along a direction intersecting with the long-side direction Z1, for example, a direction perpendicular to the long-side direction Z1. In this case, the first branch portion 181 may include a plurality of first branch portions 181 branching at different positions along the lengthwise direction of the main body 185 (corresponding to the long-side direction Z1) to detect voltage information from the first and second bus bars 161 and 162 alternately arranged along the long-side direction Z1. The first branch portion 181 may extend from the main body 185 of the flexible line 180 toward the bus bar 160, and, to shorten the length of the first branch portion 181, may form an electrical connection with the outermost comb electrodes 161a and 162a located close to the long-side portion 150S1 of the cell region C or the long-side portion S1 of the cell holder 150 where the main body 185 of the flexible line 180 is located. That is, the first branch portion 181 may form an electrical connection with the outermost comb electrodes 161a and 162a of each bus bar 160.

The first branch portion 181 may include a distant, or distal, first branch portion 181a (see regions "A3" and "A5" of FIG. 8) extending to be relatively long and a close, or proximal, first branch portion 181b (see regions "AZ" and "A4" of FIG. 8) extending to be relatively short according to a distance from the main body 185 of the flexible line 180 to the bus bar 160 (the comb electrodes 161a and 162a of the bus bar 160) a voltage of which is to be detected. In this case, in an embodiment, the distant first branch portions 181a (see regions "A3" and "A5") and the close first branch portions 181b (see regions "A2" and "A4") may be alternately arranged along the long-side direction Z1. In an embodiment, the first bus bar 161 (the comb electrode 161a of the first bus bar 161) relatively far from the long-side portion S1 of the cell region C along the arrangement direction Z2 of the comb electrodes 161a and 162a and the second bus bar 162 (the comb electrode 162a of the second bus bar 162) relatively close to the long-side portion S1 of the cell region C may be alternately arranged along the long-side direction Z1, and, according to the alternating arrangement of the first and second bus bars 161 and 162, the distant first branch portion 181a and the close first branch portion 181b may also be alternately arranged along the long-side direction Z1. That is, the distant first branch portion 181a (see regions "A3" and "A5") may detect voltage information by being connected to the first bus bar 161 (the comb electrode 161a of the first bus bar 161) relatively far from the long-side portion S1 of the cell region C, and the close first branch portion 181b (see regions "AZ" and "A4") may detect voltage information by being connected to the second bus bar 162 (the comb electrode 162a of the second bus bar 162) relatively close to the long-side portion S1 of the cell region C. In this case, the distant first branch portion 181a (see regions "A3" and "A5") may extend to a position close to the first bus bar 161 so as not to overlap onto the first bus bar 161 and may be electrically connected to the first bus bar 161 through the second connection member 22. For example, the distant first branch portion 181a may extend across the second bus bar 162 (the comb electrode 162a of the second bus bar 162) adjacent to the long-side portion S1 of the cell region C (see region "A5" of FIG. 8) or may extend toward the first bus bar 161 (the comb electrode 161a of the first bus bar 161) through a gap g between the different second bus bars 162 (the comb electrodes 162a of the second bus bars 162) (see region "A3" of FIG. 8). Further, the close first branch portion 181b (see regions "A2" and "A4" of FIG. 8) may extend onto the second bus bar 162 to overlap the second bus bar 162 and may be electrically connected to the second bus bar 162 through the second connection member 22 on the second bus bar 162 (see regions "A2" and "A4" of FIG. 8). In an embodiment, the second connection members 22 connected to the distant first branch portion 181a and the close first branch portion 181b may extend in different directions according to the relative arrangement between each first branch portion 181 and the first and second bus bars 161 and 162; for example, the second connection member 22 connected to the close first branch portion 181b may extend in the long-side direction Z1 (see regions "A2" and "A4" of FIG. 8), and the second connection member 22 connected to the distant first branch portion 181a may extend along a direction intersecting with the long-side direction Z1, for example, along the direction Z2 perpendicular to the long-side direction Z1, that is, the direction Z2 parallel to the first branch portion 181 (see regions "A3" and "A5" of FIG. 8).

As such, the first branch portion 181 may be electrically connected to the first and second bus bars 161 and 162 alternately arranged along the long-side direction Z1, to detect voltage information from each bus bar 160. However, in an embodiment, the first branch portion 181 may not be connected to all the bus bars 160 provided in the battery pack. In an embodiment, for example, the bus bar 160 located closest to the circuit board 140 may not be connected to the first branch portion 181 (see region "A6" of FIG. 8). In an embodiment, the bus bar 160 at a position adjacent to the circuit board 140 may be directly connected to the circuit board 140 and may be directly connected to the circuit board 140 through the second connection member 22, and voltage information may be directly transmitted to the circuit board 140 without passing through the first branch portion 181.

Referring to FIGS. 10 and 11, the second branch portion 182 (see region "A3" of FIG. 10) may extend at an oblique angle from the main body 185 of the flexible line 180. More particularly, the second branch portion 182 may extend in a diagonal direction between a first direction (the long-side direction Z1) in which the main body 185 extends and a second direction (the direction Z2 intersecting with the long-side direction Z1) in which the first branch portion 181 extends, and may extend along a diagonal direction concurrently (e.g., simultaneously) following the first direction Z1 and the second direction Z2. The first direction Z1 may correspond to the long-side direction Z1, and the second direction Z2 may correspond to a direction intersecting with the long-side direction Z1, for example, a direction perpendicular to the long-side direction Z1. Because the second branch portion 182 may extend in the diagonal direction between the first direction (the long-side direction Z1) in which the main body 185 extends and the second direction (the direction Z2 intersecting with the long-side direction Z1) in which the first branch portion 181 extends, the second branch portion 182 may be easily bent and interference from the first branch portion 181 and the main body 185 adjacent to the second branch portion 182 may be minimized or reduced when the second branch portion 182 is bent.

Referring to FIG. 11, the second branch portion 182 may be bent downward toward the outer peripheral surface 10c of the battery cell 10 while branching from the main body 185, and the end (e.g., the thermistor 182a formed at the end) of the second branch portion 182 may be elastically biased with respect to the outer peripheral surface 10c of the battery cell 10 under the influence of a spring-back or an elastic restoration force caused by deformation of a bent portion 180b. For example, the second branch portion 182 may extend downward through a rounded bent portion 180b, and the end (e.g., the thermistor 182a formed at the end) of the second branch portion 182 may approach the outer peripheral surface 10c of the battery cell 10 under the influence of the spring-back or the elastic restoration force. In an embodiment, the second branch portion 182 may include a rounded bent portion 180b, not an angled bent portion, and the rounded bent portion 180b may exert an elastic restoration force to effectively elastically bias the end (e.g., the thermistor 182a formed at the end) of the second branch portion 182 with respect to the outer peripheral surface 10c of the battery cell 10. For example, when the second branch portion 182 includes an angled bent portion, the elastic restoration force may be relatively weaker than the rounded bent portion 180b as an angled portion of the bent portion is plastically deformed, and, accordingly, the elastic bias tending to approach the outer peripheral surface 10c of the battery cell 10 according to the elastic restoration force of the end (e.g., the thermistor 182a formed at the end) of the second branch portion 182 may be weak. Thus, in an embodiment, the second branch portion 182 may include a rounded bent portion 180b, not an angled bent portion, and the rounded bent portion 180b may approach the end (e.g., the thermistor 182a formed at the end) of the second branch portion 182 to the outer peripheral surface 10c of the battery cell 10 and, for example, may contact the same to the outer peripheral surface 10c of the battery cell 10.

The second branch portion 182 may approach the outer peripheral surface 10c of the battery cell 10 by passing through the through hole 150' (see FIG. 11) formed in the upper cell holder 150a along a guide 192 (see FIG. 9) formed at the line holder 190. In an embodiment, the outer peripheral surface 10c of the battery cell 10 where the second branch portion 182 is elastically biased may be exposed between the upper cell holder 150a and the lower cell holder 150b, and the end (e.g., the thermistor 182a formed at the end) of the second branch portion 182 passing through the upper cell holder 150a may approach the outer peripheral surface 10c of the battery cell 10 exposed between the upper cell holder 150a and the lower cell holder 150b.

Referring to FIG. 11, a thermally conductive adhesive TS, such as thermal silicone, may be located between the end (e.g., the thermistor 182a formed at the end) of the second branch portion 182 and the outer peripheral surface 10c of the battery cell 10 to firmly maintain the thermal coupling therebetween.

Referring to FIG. 9, the battery cell 10, e.g., a first battery cell, of which temperature is to be detected according to the approach of the second branch portion 182 may be the battery cell 10 of which the outer peripheral surface 10c is exposed through the long-side portion S1 of the cell region C. Because the second branch portion 182 branches from the main body 185 of the flexible line 180 arranged at the long-side portion S1 of the cell region C, it may easily approach the battery cell 10 where the outer peripheral surface 10c is exposed through the long-side portion S1 of the cell region C.

Referring to FIGS. 8 and 9, the second branch portion 182 may branch at one or more points along the main body 185 of the flexible line 180 (see regions "A1" and "A3" in FIG. 9). The second branch portion 182 may branch from the main body 185 of the flexible line 180 arranged at the long-side portion S1 of the cell region C and approach the outer peripheral surface 10c of the battery cell 10 adjacent to the long-side portion S1 to detect temperature information. That is, the second branch portion 182 may pass through the cell holder 150 at a position adjacent to the long-side portion S1 of the cell region C and approach the outer peripheral surface 10c of the battery cell 10 adjacent to the long-side portion S1. In an embodiment, because the second branch portion 182 may hardly approach the outer peripheral surface 10c of the battery cell 10 at a point where the second bus bar 162 (the comb electrode 162a of the second bus bar 162) relatively adjacent to the long-side portion S1 of the cell region C is arranged, as long as it does not pass through the second bus bar 162, the second branch portion 182 may be formed at a position excluding the second bus bar 162 so as not to be disturbed by the second bus bar 162 relatively adjacent to the long-side portion S1. That is, the second branch portion 182 may branch at a position excluding the second bus bar 162 along the main body 185 of the flexible line 180 (see regions "A1" and "A3" in FIG. 8). In an embodiment, the second branch portion 182 may branch at a position corresponding to a gap g between different second bus bars 162 (the comb electrodes 162a of the second bus bars 162) along the main body 185 of the flexible line 180 (see region "A3" in FIG. 8). Also, the second branch portion 182 may branch at a position between the circuit board 140 and the second bus bar 162 (the comb electrode 162a of the second bus bar 162) along the main body 185 of the flexible line 180, that is, at a position where the flexible line 180 starts to extend from the circuit board 140.

Referring to FIGS. 9 and 10, at a position corresponding to a gap g between the different second bus bars 162 (the comb electrodes 162a of the second bus bars 162) (see region "A3"), the second branch portion 182 may branch from the main body 185 together with the distant first branch portion 181a and may be bent downward toward the outer peripheral surface 10c of the battery cell 10 while extending in a diagonal direction between the main body 185 and the first branch portion 181. In this case, a cut groove 180' may be formed around the bent portion 180b of the second branch portion 182 such that the bending of the second branch portion 182 may not be prevented by the first branch portion 181 and the main body 185 extending in different directions while being adjacent to the second branch portion 182.

Referring to FIGS. 9 and 10, at a position adjacent to the circuit board 140 (see region "A1"), the second branch portion 182 may extend in a diagonal direction from the main body 185 of the flexible line 180 to be bent downward toward the outer periphery of the battery cell 10. In an embodiment, the second branch portion 182 at a position adjacent to the circuit board 140 (see region "A1") and the second branch portion 182 at a position corresponding to the gap g between the different second bus bars 162 (see region "A3") may branch from the main body 185 along substantially the same diagonal direction with respect to the main body 185 of the flexible line 180. Further, at a position where the circuit board 140 and the main body 185 of the flexible line 180 are connected to each other (see region "A1"), the main body 185 of the flexible line 180 may be formed to have a relatively large width and a cut groove 180' may be formed around the bent portion 180b of the second branch portion 182 such that the second branch portion 182 may be easily bent.

Referring to FIG. 8, in an embodiment, the flexible line 180, that is, the main body 185 of the flexible line 180, may be located at the long-side portion S1 of the cell region C or the long-side portion 150S1 of the cell holder 150. In various embodiments, the main body 185 of the flexible line 180 may be arranged at an edge position of the cell holder 150 or the cell region C. In the cell region C, because an electrical connection is formed between a plurality of battery cells 10 and the bus bar 160, the flexible line 180 may be arranged at a position corresponding to the edge of the cell region C so as not to disturb the electrical connection between the battery cell 10 and the bus bar 160. Also, the first and second branch portions 181 and 182 branching from the main body 185 of the flexible line 180 may extend from the edge of the cell region C toward the cell region C.

Referring to FIG. 9, the flexible line 180 may be accommodated in the line holder 190 arranged on the cell holder 150 and may be insulated and protected from a peripheral environment in the line holder 190. Also, the line holder 190 may provide a solid support base for the flexible line 180, thereby allowing wire bonding to the flexible line 180. For example, the first branch portion 181 of the flexible line 180 (the conductive pad at the end of the first branch portion 181) and the bus bar 160 may be electrically connected to each other through wire bonding (corresponding to the second connection member 22 of FIG. 8). In an embodiment, the line holder 190 may provide a channel-shaped groove for accommodating the flexible line 180 and may be formed of an insulating material. In an embodiment, for example, the line holder 190 may be formed of a resin material, like the cell holder 150. In an embodiment, the line holder 190 may extend in substantially a same form as the flexible line 180 to support the first branch portion 181 and the main body 185 of the flexible line 180 and may guide the second branch portion 182 downward toward the battery cell 10. That is, the second branch portion 182 may extend in a downward direction of the line holder 190 through the guide 192 of the line holder 190 and may approach the outer peripheral surface 10c of the battery cell 10. In an embodiment, the line holder 190 may include a main body 195 for supporting the main body 185 of the flexible line 180, a branch portion 191 for supporting the first branch portion 181, and a guide 192 for guiding the second branch portion 182 and may have a shape corresponding to each of the main body 185, the first branch portion 181, and the second branch portion 182 of the flexible line 180 to have a shape matching the shape of the flexible line 180.

According to one or more embodiments of the disclosure, in order to detect temperature information and voltage information of a plurality of battery cells together, state information of a battery cell may be collected through a branch portion branching from a main body arranged at an edge of a cell region toward the cell region.

According to an aspect of one or more embodiments of the disclosure, voltage information may be detected from different bus bars through a flexible line including first and second branch portions having a voltage sensing structure and a temperature sensing structure, while temperature information may be collected from an outer peripheral surface of a battery cell exposed through a side surface of a cell region.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as set forth by the following claims.

What is claimed is:

1. A battery pack comprising:
   a plurality of battery cells electrically connected to each other and arranged in a cell region; and
   a flexible line comprising a main body arranged at an edge of the cell region, a plurality of first branch portions to detect voltage, and a plurality of second branch portions to detect temperature,
   wherein the first and second branch portions branch branching from the main body toward the cell region, and
   wherein at least one of the first branch portions and at least one of the second branch portions branch together from the main body.

2. The battery pack of claim 1, wherein
the cell region comprises a plurality of side portions extending in a straight line to surround outer peripheral surfaces of the plurality of battery cells,
the main body of the flexible line extends in a first direction along a long-side portion of the plurality of side portions,
the first branch portions extend in a second direction crossing the first direction, and
the second branch portions extend in a diagonal direction between the first and second directions to follow the first direction and the second direction.

3. The battery pack of claim 2, wherein the main body of the flexible line extends from a circuit board arranged at a corner position of the cell region contacting the long-side portion.

4. The battery pack of claim 2, further comprising a plurality of bus bars electrically connecting the plurality of battery cells.

5. The battery pack of claim 4, wherein
first and second electrodes are formed at an upper end portion of each of the plurality of battery cells, and
the first and second electrodes of the plurality of battery cells are electrically connected to the plurality of bus bars through a first connection member.

6. The battery pack of claim 4, wherein the flexible line is arranged on the plurality of bus bars.

7. The battery pack of claim 4, wherein the first branch portions are electrically connected to the plurality of bus bars.

8. The battery pack of claim 4, wherein bus bars of the plurality of bus bars are arranged along the first direction.

9. The battery pack of claim 4, wherein
the bus bars of the plurality of bus bars define a plurality of parallel modules comprising battery cells connected in parallel to each other, among the plurality of battery cells, and
parallel modules of the plurality of parallel modules are arranged along the first direction.

10. The battery pack of claim 9, wherein the plurality of bus bars comprises first and second bus bars comprising comb electrodes adjacent to each other and extending in opposite directions from different base portions arranged with a parallel module of the parallel modules therebetween.

11. The battery pack of claim 10, wherein
a comb electrode of the second bus bar is arranged at an outermost side along an arrangement direction of the comb electrodes, and
a comb electrode of the first bus bar is arranged at an inner position of the outermost side along the arrangement direction of the comb electrodes.

12. The battery pack of claim 11, wherein the first branch portions comprise:
a distal first branch portion electrically connected to the first bus bar and extending to be relatively long; and
a proximal first branch portion electrically connected to the second bus bar and extending to be relatively short.

13. The battery pack of claim 12, wherein the distal first branch portion and the proximal first branch portion are alternately arranged along a long-side direction in which the main body of the flexible line extends.

14. The battery pack of claim 4, wherein
a conductive pad is located at an end of the first branch portions portion, and
the conductive pad and each bus bar are electrically connected to each other through a second connection member.

15. The battery pack of claim 2, wherein while extending along the diagonal direction, one of the second branch portions is bent toward an outer peripheral surface of a first battery cell among the plurality of battery cells to be elastically biased with respect to the outer peripheral surface of the first battery cell.

16. The battery pack of claim 15, wherein the first battery cell is a battery cell of which the outer peripheral surface is exposed through the long-side portion of the cell region, among the plurality of battery cells.

17. The battery pack of claim 2, further comprising first and second bus bars electrically connecting the plurality of battery cells and comprising comb electrodes adjacent to each other,
wherein the second branch portions are is at positions a position excluding the second bus bar comprising an outermost comb electrode relatively adjacent to the long-side portion of the cell region along an arrangement direction of the comb electrodes.

18. The battery pack of claim 2, further comprising a line holder comprising a channel-shaped groove to accommodate the flexible line.

19. The battery pack of claim 18, wherein p1 ends of the first branch portions are is supported on the line holder, and
a bus bar and a conductive pad respectively located at the ends of the first branch portions are electrically connected to each other by wire bonding.

20. The battery pack of claim 19, wherein the line holder comprises a main body to support the main body of the flexible line, a branch portion to support the first branch portion, and a guide to guide the second branch portion.

21. The battery pack of claim 20, further comprising a cell holder at which the plurality of battery cells are assembled,
wherein the second branch portions extend toward an outer peripheral surface of a battery cell of the battery cells exposed from the cell holder by passing through a through hole of the cell holder along the guide of the line holder.

22. The battery pack of claim 1, wherein the main body, the first branch portions, and the second branch portions are integrally formed as the flexible line.

* * * * *

UNITED STATES PATENT AND TRADEMARK OFFICE
CERTIFICATE OF CORRECTION

PATENT NO. : 11,831,034 B2
APPLICATION NO. : 17/133878
DATED : November 28, 2023
INVENTOR(S) : Byungkook Ahn It is certified that error appears in the above-identified patent and that said Letters Patent is hereby corrected as shown below:

In the Claims

In Column 16, Line 63, in Claim 1, before "from" delete "branching".

In Column 18, Line 9, in Claim 14, delete "portions portion," and insert -- portions, --.

In Column 18, Line 27, in Claim 17, after "are" delete "is".

In Column 18, Lines 27-28, in Claim 17, after "at positions" delete "a position".

In Column 18, Line 36, in Claim 19, after "wherein" delete "p1".

In Column 18, Line 37, in Claim 19, after "are" delete "is".

Signed and Sealed this
Second Day of April, 2024

Katherine Kelly Vidal
*Director of the United States Patent and Trademark Office*